United States Patent
Motoe et al.

(10) Patent No.: US 9,506,824 B2
(45) Date of Patent: Nov. 29, 2016

(54) MAGNETOSTRICTIVE FILM, MAGNETOSTRICTIVE ELEMENT, TORQUE SENSOR, FORCE SENSOR, PRESSURE SENSOR, AND MANUFACTURING METHOD THEREFOR

(75) Inventors: Yoshitsugu Motoe, Tokyo (JP); Koji Nakashima, Tokyo (JP);
(Continued)

(73) Assignee: JAPAN SCIENCE AND TECHNOLOGY AGENCY, Kawaguchi-Shi, Saitama (JP)

( * ) Notice: Subject to any disclaimer, the term of this patent is extended or adjusted under 35 U.S.C. 154(b) by 340 days.

(21) Appl. No.: 13/388,528

(22) PCT Filed: Jul. 30, 2010

(86) PCT No.: PCT/JP2010/062928
§ 371 (c)(1),
(2), (4) Date: Feb. 2, 2012

(87) PCT Pub. No.: WO2011/016399
PCT Pub. Date: Feb. 10, 2011

(65) Prior Publication Data
US 2012/0128970 A1   May 24, 2012

(30) Foreign Application Priority Data
Aug. 3, 2009   (JP) ................. 2009-180848

(51) Int. Cl.
*B32B 15/00* (2006.01)
*G01L 3/10* (2006.01)
(Continued)

(52) U.S. Cl.
CPC ............. *G01L 3/102* (2013.01); *C22C 33/003* (2013.01); *C22C 45/02* (2013.01); *C23C 4/06* (2013.01);
(Continued)

(58) Field of Classification Search
None
See application file for complete search history.

(56) References Cited

U.S. PATENT DOCUMENTS 5,585,574 A * 12/1996 Sugihara et al. ........ 73/862.334
2002/0078765 A1   6/2002 Shinoura
2005/0236071 A1  10/2005 Koshiba et al.

FOREIGN PATENT DOCUMENTS

JP   05-149804   6/1993
JP   07-118786   5/1995
(Continued)

OTHER PUBLICATIONS

Makino, Soft magnetic Fe—Si—B—P—C bulk metallic glasses without any glass-forming metal elements, Journal of Alloys and Compounds 483 (2009), 616-619.*
(Continued)

*Primary Examiner* — Holly Rickman
*Assistant Examiner* — Linda Chau
(74) *Attorney, Agent, or Firm* — Rankin, Hill & Clark LLP

(57) ABSTRACT

For providing a magnetostrictive film that can exhibit high magnetostrictive properties in the vicinity of zero magnetic field and their manufacturing methods, a magnetostrictive film thermal sprayed on an object under test includes a metallic glass film subjected to thermal processing at a temperature lower than the glass transition temperature and not lower than the Curie point, and shows a linearity between the magnetic field and the magnetostriction in at
(Continued)

least a part of the magnetic field from −15 kA/m to +15 kA/m (both inclusive).

11 Claims, 10 Drawing Sheets

(75) Inventors: Tomohito Ishikawa, Tokyo (JP);
Masaharu Sugiyama, Tokyo (JP);
Takanori Igarashi, Tokyo (JP);
Hiroyuki Wakiwaka, Nagano (JP);
Akihiro Makino, Sendai (JP); Akihisa Inoue, Sendai (JP)

(51) Int. Cl.
*C22C 33/00* (2006.01)
*C22C 45/02* (2006.01)
*C23C 4/06* (2016.01)
*G01R 33/18* (2006.01)
*H01F 10/13* (2006.01)
*H01L 41/12* (2006.01)
*H01L 41/47* (2013.01)
*H01L 41/20* (2006.01)

(52) U.S. Cl.
CPC .............. *G01L 3/103* (2013.01); *G01L 3/105* (2013.01); *G01R 33/18* (2013.01); *H01F 10/131* (2013.01); *H01L 41/125* (2013.01); *H01L 41/20* (2013.01); *H01L 41/47* (2013.01); *Y10T 428/265* (2015.01)

(56) References Cited

FOREIGN PATENT DOCUMENTS

| JP | 07-297462 | 11/1995 |
|---|---|---|
| JP | 09-083037 | 3/1997 |
| JP | 10-176966 | 6/1998 |
| JP | 2001-041833 | 2/2001 |
| JP | 2002-250662 | 9/2002 |
| JP | 2003-045708 | 2/2003 |
| JP | 2005-340429 | 12/2005 |
| JP | 3946226 | 7/2007 |

OTHER PUBLICATIONS

Patent Abstracts of Japan and Computer Translation of JP 2001-041833 published Feb. 16, 2001, twelve pages.
Patent Abstracts of Japan and Computer Translation of JP 2003-045708 published Feb. 14, 2003, forty-six pages.
Patent Abstracts of Japan and Computer Translation of JP 2005-340429 published Dec. 8, 2005, twelve pages.
Patent Abstracts of Japan and Computer Translation of JP 2006-214000 (corresponding publication of JP 3946226), published Aug. 17, 2006, thirty-one pages.
Patent Abstracts of Japan and Computer Translation of JP 05-149804 published Jun. 15, 1993; twelve pages.
Patent Abstracts of Japan and Computer Translation of JP 07-297462 published Nov. 10, 1995, fifteen pages.
Patent Abstracts of Japan and Computer Translation of JP 07-118786 published May 9, 1995, nine pages.
Patent Abstracts of Japan and Computer Translation of JP 09-083037 published Mar. 28, 1997, twenty-nine pages.
Patent Abstracts of Japan and Computer Translation of JP 10-176966 published Jun. 30, 1998, nineteen pages.
International Search Report—PCT/JP2010/062928 dated Aug. 24, 2010, two pages.
PCT Notification of Transmittal of Translation of the International Preliminary Report on Patentability and PCT Written Opinion Translation—PCT/JP2010/062928 dated Mar. 22, 2012, six pages.
European Search Report, Application No. 10806398.3, dated Apr. 29, 2013, 6 pages.

* cited by examiner

BLOCK DIAGRAM OF TORQUE MEASUREMENT BY MTS

MAGNETOSTRICTIVE FILM, MAGNETOSTRICTIVE ELEMENT, TORQUE SENSOR, FORCE SENSOR, PRESSURE SENSOR, AND MANUFACTURING METHOD THEREFOR

FIELD OF THE INVENTION

The present invention relates to magnetic materials using metallic glass, and more specifically, to a magnetostrictive film, a magnetostrictive element, a torque sensor, a force sensor, and a pressure sensor that exhibit high magnetostrictive properties around zero magnetic field, and their manufacturing methods.

BACKGROUND ART

Magnetostrictive materials are used for torque sensors and the like, for example, for detecting torque on the transmission shaft of electric power-assisted bicycles. A torque sensor is usually configured by attaching a thin film of a magnetostrictive material on the surface of the torque transmission shaft. The torque sensor detects deformation of the transmission shaft caused by a rotary torque, from a change in magnetic permeability of the magnetostrictive material deformed by the deformation, and measures the magnitude and direction of the torque. The change in magnetic permeability of the magnetostrictive material is detected from a change in inductance of a solenoid coil disposed so as not to contact the magnetostrictive material.

A study using an amorphous alloy as a magnetostrictive material is known (patent literature 1). The magnetostrictive material has an amorphous structure produced by a single-roll liquid quenching technique and also a microcrystallite precipitated by a thermal process. The properties of the magnetically isotropic amorphous structure, rather than those of the magnetically anisotropic crystalline structure, are used.

Patent Literature 1: Japanese Unexamined Patent Publication No. Hei-7-118786
Patent Literature 2: Japanese Patent No. 3946226
Patent Literature 3: Japanese Unexamined Patent Publication No. Hei-5-149804
Patent Literature 4: Japanese Unexamined Patent Publication No. 2001-41833
Patent Literature 5: Japanese Unexamined Patent Publication No. Hei-10-176966

DISCLOSURE OF THE INVENTION

Problem to be Solved by the Invention

Formation of a magnetostrictive material by the liquid quenching technique as disclosed in Patent Literature 1 requires large-scale equipment, causing a problem in terms of manufacturing cost. The formed amorphous alloy has a ribbon shape and must be attached to the surface of the object under test which is subjected to a torque and could come off from the object under test.

Although some magnetostrictive effects are obtained in a magnetic field of 50 to 100 kA/m, favorable magnetostrictive properties are not obtained in a magnetic field up to 50 kA/m (see FIGS. 1 and 2 in Patent Literature 1).

In the search for a magnetostrictive film or a magnetostrictive element exhibiting favorable magnetostrictive properties around zero magnetic field, the inventors could not find any element exhibiting a favorable response in an applied magnetic field of up to 15 kA/m. Then, based on knowledge of thermal spray-formed metallic glass that has been studied for many years (see Patent Literature 2), the inventors have strived to develop a magnetostrictive film and a magnetostrictive element showing favorable magnetostrictive properties in a magnetic field of −15 kA/m to +15 kA/m (both inclusive).

In view of the problems described above, it is an object of the present invention to provide a magnetostrictive film and a magnetostrictive element that can exhibit high magnetostrictive properties in the vicinity of zero magnetic field, a force sensor, a torque sensor, and a pressure sensor using them, and their manufacturing methods.

Means of Solving the Problem

As a result of study for achieving the object described above, the inventors have found that by using a thermal spraying technique for depositing metallic glass in a supercooled liquid state on the object under test, a strong magnetostrictive film showing favorable magnetostrictive properties in the vicinity of zero magnetic field is formed, and have thus completed the present invention.

A magnetostrictive film according to the present invention is thermal sprayed on the object under test, includes a metallic glass film subjected to thermal processing at a temperature lower than the glass transition temperature and not lower than the Curie point, and shows a linearity between the magnetic field and the magnetostriction in at least a part of the magnetic field from −15 kA/m to +15 kA/m (both inclusive).

The metallic glass should preferably contains Fe in a range of 30 to 80 atomic percent as its main constituent.

A preferred metallic glass is Fe—Si—B-M or Fe—Si—B—P—C-M (M=Cr, Nb, Ta, W, Ni, Co, Hf, Mo or M=none).

It is preferred that the metallic glass be $Fe_{76}Si_{5.7}B_{9.5}P_5C_{3.8}$.

The metallic glass film is preferably formed by high-velocity flame spraying or plasma spraying. A preferable thickness of the metallic glass film is 50 μm or greater.

A magnetostrictive element according to the present invention includes the magnetostrictive film and performs interconversion between mechanical energy and magnetic energy.

A torque sensor, a force sensor, and a pressure sensor according to the present invention use the magnetostrictive film or the magnetostrictive element.

A magnetostrictive film manufacturing method according to the present invention shows a linearity between the magnetic field and the magnetostriction at least a part of the magnetic field from −15 kA/m to +15 kA/m (both inclusive), includes a metallic glass film forming process on the object under test by thermal spraying, using high-velocity flame spraying or plasma spraying as the thermal spraying, and a thermal process at a temperature lower than the glass transition temperature and not lower than the Curie point after the thermal spraying.

Effect of the Invention

In the characteristic curve of the amount of magnetostriction versus the increase or decrease in the magnetic field applied to a magnetostrictive film and a magnetostrictive element, the characteristics of a part represented by a linear function (straight line) between a change in the strength of the magnetic field and a change in the amount of magnetostriction is referred to here as linearity of the magnetostrictive film and the magnetostrictive element. It is widely known that a magnetostrictive film or a magnetostrictive element having the linearity between the two variables can be used more easily as a sensor than that having the relationship of a multidimensional function between the variables.

When a magnetic field is applied, starting from zero, the magnetostrictive film and magnetostrictive element according to the present invention can exhibit favorable linearity even in the magnetic field ranging from −15 kA/m to +15 kA/m (both inclusive). In other words, when a magnetic field is applied, the magnetic-field-versus-magnetostriction curve quickly rises to the range of linearity, and favorable magnetostrictive properties can be provided in a magnetic field smaller than ever before.

Since the magnetostrictive film and the magnetostrictive element according to the present invention exhibit satisfactory linearity in a small magnetic field (range of ±15 kA/m), when one of them is used for a force sensor or a torque sensor, the conditions of use for the magnetostrictive element as given in Patent Literature 3, such as the application of an initial strain, become unnecessary.

A force sensor, a torque sensor, and a pressure sensor use the inverse magnetostrictive effect of the magnetostrictive film and magnetostrictive element. The magnetostrictive film and magnetostrictive element of the present invention rise quickly to the range of linearity and exhibit linearity in a range exceeding a very small magnetic field H1, as a curve 1 shown in FIG. 1, for example. Consequently, it can be fully expected that linearity of an inverse magnetostrictive effect can be obtained if magnetostriction due to an external force is approximately ϵ1 or above, and minute magnetostriction can be detected in comparison with a sensor using a conventional magnetic material, as shown by a curve 2.

In the present invention, by conducting thermal process after thermal spray forming the magnetostrictive film on the object under test, residual stress is eliminated to remove a very small strain in the magnetostrictive film caused by thermal spray forming. For that purpose, the temperature conditions are set to be lower than the glass transition temperature of the metallic glass and not lower than the Curie point.

The conventional thermal spray-formed magnetostrictive films compared with that of the present invention include ones formed by thermal spraying particles of magnetic metals other than metallic glass, as disclosed in Patent Literature 4 and 5. The magnetic material in Patent Literature 4 and 5 is called Permalloy, which is formed of a Ni—Fe alloy as its main constituent. Spray forming using Ni—Fe alloy particles forms a film at least by spraying fused particles, so that the adhesion strength and fineness of the film can be improved. Therefore, the thermal sprayed film includes many oxide layers, and the film inevitably has a high oxygen concentration. The presence of the oxide layers becomes an obstruction for the linearity of the magnetic film. Therefore, after the magnetic film of Patent Literature 4 or 5 is thermal spray-formed, thermal processing for deoxidizing the oxide layers is performed at a temperature ranging from about 950° C. to 1100° C. in a reducing atmosphere. This thermal processing is very expensive, and thermal process management is difficult.

The magnetostrictive film according to the present is formed by thermal spraying metallic glass in a super-cooled liquid state. Therefore, when a metallic glass in the super-cooled liquid state hits the substrate surface, it instantly collapses and spreads thin over the substrate surface, thus, a very excellent splat can be formed, because the viscosity of the metallic glass is low. Then the splats accumulation structure in a super-cooled liquid state is cooled, and a dense thermal sprayed coating, without pinholes, of an amorphous phase is formed.

Thus, in the present invention, since the thermal sprayed coating is formed with metallic glass in an unmelted state, an oxide is hard to be contained in the coating, and the coating has a lower oxygen concentration compared with the magnetic film of Patent Literature 4 or 5, and the high grade thermal process for deoxidizing the oxide is not needed.

BEST MODE FOR CARRYING OUT THE INVENTION

Object Under Test

Figure 1:
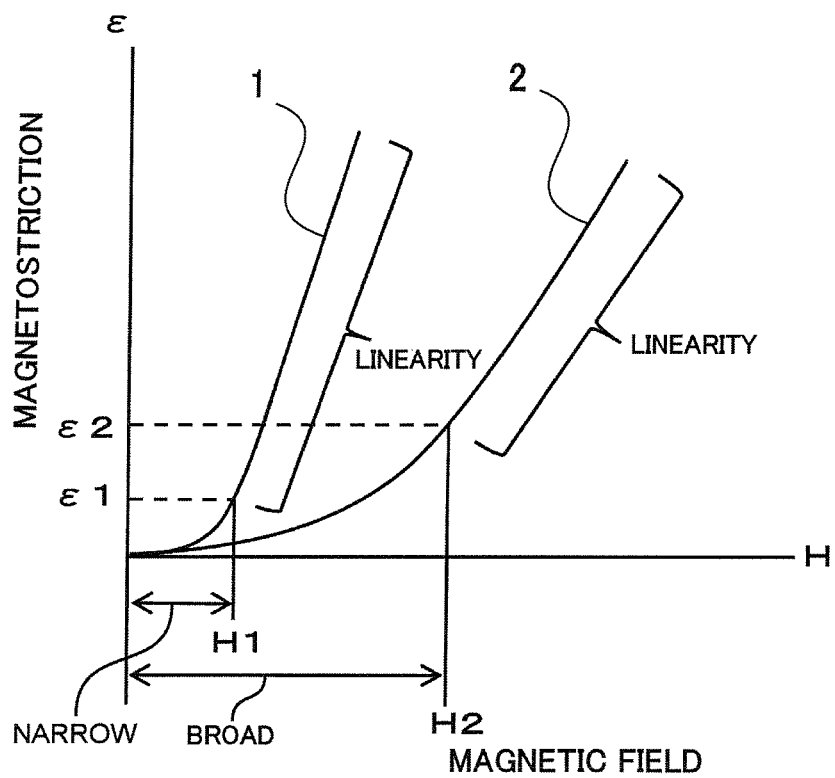
FIG. 1 is a view for illustrating the magnetostrictive properties of a magnetostrictive film according to the present invention.

The object under test used in the present invention constitutes a transmission element such as a power transmission shaft. More specifically, the object under test is required to directly detect a torque or stress generated by applying an external force. On the surface of the object under test, used as the substrate, a metallic glass film is formed by thermal spraying. The substrate is not limited, but a metallic material selected from copper, aluminum, magnesium, titanium, iron, nickel, molybdenum, and an alloy having at least one of these metals as its main constituent is preferably used. The substrate may be subjected to substrate surface roughening by a known method such as blasting, to improve the adhesion of the thermal sprayed metallic glass film.

Metallic Glass

Metallic glass is characterized by its exhibition of a distinct glass transition and a wide super-cooled liquid temperature range, when it is heated, before crystallization.

In the temperature region between the glass transition temperature (Tg (K)) and the crystallization initiation temperature (Tx (K)), namely, the super-cooled liquid temperature range ΔTx=Tx-Tg, the flow stress of the metallic glass markedly decreases in the viscous flow state (the super-cooled liquid state). Thus, metallic glass in the super-cooled liquid state excels in the possibility of the deposition. In the present invention, a metallic glass with the super-cooled liquid temperature range ΔTx=Tx-Tg equal to or more than 30° C. is preferably used.

It is desirable that a metallic glass consists of a plurality of elements. However, the composition of metallic glass in the present invention is not limited in particular, and the proper composition can be chosen from publicly known compositions depending upon the function of the purpose. For example, a metallic glass in which at least one element from the group of Fe, Co, Ni is contained, as its main component, in the range of 30-80 atomic % can be chosen.

Although a crystalline structure has a magnetic crystalline anisotropy energy that reorientates spin in a single crystal to the magnetization easy axis, since metallic glass is in the amorphous state, the magnetic anisotropy energy decreases, magnetization becomes easy in a small magnetic field, large magnetostriction is obtained, and high soft magnetism is exhibited. Being in the amorphous state, it is free from grain boundaries, voids (vacancies made by lattice defects), or precipitation, which could cause magnetic-wall pinning, also contributing to high soft magnetism.

If metallic glass is used as a magnetic material, as in the present invention, metallic glass having a high concentration of matter showing ferromagnetism at room temperature is preferable. Matter showing ferromagnetism at room temperature includes iron, cobalt, nickel, and gadolinium. In terms of the ease of forming metallic glass and the ease of obtaining materials, the main constituent preferably contains an atom of any one of Fe, Co, and Ni at least. Particularly, if the metallic glass contains a high concentration of Fe as its constituent element, saturation magnetization (Js), which is a basic property of the ferromagnetic material, improves tremendously. A preferable Fe concentration in the metallic glass is 30 to 80 atomic percent. A small Fe concentration of up to 30 atomic percent leads to insufficient magnetic properties, and a high concentration above 80 atomic percent makes it difficult to form metallic glass.

If metallic glass is used as a magnetic component, Fe-based metallic glass such as Fe—Si—B, Fe—P—C, and Fe—Si—P is preferred. Since Fe has greater magnetic anisotropy than other elements, metallic glass with a high Fe concentration produces a high level of magnetostriction. By applying an external magnetic field during formation, magnetic anisotropy can be easily induced.

It is preferable that the Fe—Si—B metallic glass contain P as an element for improving the glass formation ability and C as an auxiliary element for improving the glass formation ability. Therefore, preferred compositions of Fe-based metallic glass include Fe—Si—B-M and Fe—Si—B—P—C-M (M=Cr, Nb, Ta, W, Ni, Co, Hf, Mo or M=none). The preferred composition is expressed below:

$$Fe_{100-a-b}(Si_kB_lP_mC_n)_aM_b$$

where $20 \leq a \leq 70$, $0 \leq b \leq 10$, $0.04 \leq k \leq 0.7$, $0.15 \leq l \leq 1.05$, $0 \leq m \leq 0.53$, and $0 \leq n \leq 0.35$. The Si concentration (atomic percent) is given by k×a.

Particularly, the composition $Fe_{76}Si_{5.7}B_{9.5}P_5C_{3.8}$ is preferred used.

The magnetostrictive film of the present invention is formed of a thermal sprayed metallic glass film having high magnetostrictive properties. Here, an element having an efficient interconversion function between mechanical energy causing distortion and magnetic energy caused by a change in magnetic permeability is referred to as a magnetostrictive element.

Properties required in order to use the magnetostrictive film or magnetostrictive element as a sensor include a large magnetomechanical coupling coefficient K and easy-of-formation of induced magnetic anisotropy. A large magnetomechanical coupling coefficient K increases the amount of magnetostriction with respect to the applied magnetic field, improving the sensor sensitivity. Easy-of-formation of induced magnetic anisotropy means that the easy magnetization axis can be easily aligned with a desired direction, and the aligned easy magnetization axis produces a large amount of magnetostriction even in a small magnetic field. It becomes easy to induce magnetic anisotropy by adding a second transition metal such as Cr, Nb, Ta, W, Ni, Co, Hf, or Mo to the first transition metal, Fe. The second transition metal has the effects of increasing the magnetostriction and improving the magnetomechanical coupling coefficient K, consequently improving the performance of the film or the element as a sensor.

A magnetostrictive film and a magnetostrictive element having a small elastic modulus are preferred. If the elastic modulus, such as Young's modulus, is low, when the element is deformed, small residual stress is produced in the element. This improves the capability of the magnetostrictive element to follow torsional deformation of the object under test, such as a rotating shaft.

Thermal Spraying Method

The thermal spraying method is not limited in particular, for example, they include atmospheric plasma spraying, vacuum plasma spraying, flame spraying, high-velocity flame spraying (high-velocity oxygen-fuel spraying (HVOF), high-velocity air-fuel spraying (HVAF)), arc spraying, and cold spraying. One preferable thermal spraying method is high-velocity flame spraying using metallic glass particles, which can spray a high-quality film. A thermal spraying method that can give metallic glass particles a thermal spray particle speed higher than or equal to the speed that can be given by the high-velocity flame spraying method can also be appropriately used. For example, atmospheric plasma spraying equipment is capable of thermal spraying at the same speed and temperature range as high-velocity flame spraying. According to the present invention, a thermal spray particle speed of 300 m/s or higher is preferable.

In standard plasma spraying, the particle speed ranges from 150 to 300 m/s, and the flame temperature ranges from 10,000 to 15,000 K, and the plasma jet (flame) is about 5,000 K at a distance of about 40 mm from the heat source. In flame spraying, the particle speed ranges from 100 to 200 m/s, and the flame temperature ranges from 2,300 to 2,900 K. Arc spraying has a particle speed ranging from 180 to 220 m/s, which is equivalent to that of flame spraying. Cold spraying accelerates particles by a gas heated to about 573 to 773 K and causes particles to collide at a speed higher than or equal to 500 m/s.

High-velocity flame spraying (HVOF, HVAF) has the same flame temperature range as flame spraying and has a particle speed of 300 m/s or higher, which is more than twice the speed achieved by the standard plasma spraying.

Porosity produced by thermal spraying a general thermal sprayed metallic material depends on the thermal spraying method: about 12% by flame spraying, about 8% by arc spraying, about 7% by plasma spraying, and about 4% by high-velocity flame spraying. By using atmospheric plasma equipment or cold spray equipment either of which is capable of spraying in the same speed and temperature range as high-velocity flame spraying, or by using high-velocity flame spraying equipment, the porosity can be lowered, and a difficult-to-peel-off film with high adhesion can be obtained.

An adequate amount of heat given to the thermal spray material needs to be the smallest possible amount of heat that can bring at least some of the metallic glass particles into a super-cooled liquid state. In comparison with the usual thermal spray material, the amount of consumed heat can be reduced. With a thermal spraying method having a particle speed of up to 300 m/s, which would increase the porosity, the thermal spraying distance must be reduced to provide a dense sprayed film, and the substrate is likely to be affected by the heat source of the spraying flame. The high-velocity flame spraying method, which allows a sufficient thermal spraying distance and produces a low porosity, or a thermal spraying method that can produce a particle speed greater than or equal to that provided by the high-velocity flame spraying method is preferable.

The shape of the metallic glass particle is not limited in particular, and they include plates, chips, particles, and powder. Preferably they are particles or powder since their shape can make it easy to feed the metallic glass particle from a raw material supply equipment into a thermal spray gun, and can make it possible to supply calorie homogeneously with the high-velocity flame. As for the preparation method of metallic glass particles, there are atomization, chemical alloying, and mechanical alloying. If the productivity is considered, the preparation by atomization is preferable.

The diameter of metallic glass particles ranges from 1 to 80 µm, or 5 to 60 µm preferably. Particles with excessively large diameter would increase the number of pores in the thermal sprayed film or would produce a continuous pore. Particles with excessively small diameter would decrease the productivity because the particles would stick to the inner wall of the spray barrel or would require a greater number of thermal sprayings to produce a desired thickness, for example. If particles solidified on the inner wall of the barrel come off and are sprayed, the thermal sprayed film thickness becomes less uniform.

A desired thickness of the thermal sprayed metallic glass film can be set to serve the intended purpose, but it is necessary to form a film with a thickness of 20 µm or greater usually, 50 µM or greater typically, and 100 µm or greater preferably, on the surface of the substrate to be coated, in view of denseness, adhesion, and workability. The upper limit is not specified particularly, but since an excessively thick film would decrease economic efficiency and low weight properties, a thickness of up to 700 µm is appropriate, and up to 500 µm is preferable. To utilize the magnetostrictive properties of the film, a thickness around 500 µm would be sufficient.

The thermal sprayed film can be formed on substrates of a variety of shapes and can be formed into patterns by masking or the like.

In order to allow the metallic glass film to show high functionality as a sensor, it is preferred that a crystal phase be eliminated from the thermal sprayed layer as far as possible, to give high denseness and uniformity. A thermal sprayed layer of metallic glass containing a crystal phase would store magnetic crystalline anisotropy energy and lower the soft magnetic properties.

In order to form a thermal sprayed coating, with almost no pores and no pinholes, of a homogeneous amorphous metallic glass, using the metallic glass particle of an amorphous phase as raw material, thermal spraying the metallic glass particle in an unmelted state, and thermal spraying at least part of the metallic glass particle in the super-cooled liquid state is preferable.

In the super-cooled liquid state, the viscosity of the metallic glass is low and it shows viscous flow. Therefore, when a metallic glass in the super-cooled liquid state hits the substrate surface, it instantly collapses and spreads thin over the substrate surface; thus, a very thin excellent splat can be formed. A dense thermal sprayed coating without pinholes can be formed by the accumulation of these splats.

In addition, because the splats are cooled in the super-cooled liquid state, only an amorphous phase is obtained without the formation of a crystalline phase.

Generally, in the case of thermal spraying in the atmosphere, because of crash thermal spray material in a melted state into the substrate surface while spraying, oxide of thermal spray material is incorporated in the coating. Thus, undesirable effects are exerted to the properties of the coating. If the thermal spray material is allowed to hit in the supercooled liquid state, there is hardly any effect of oxidation even if thermal spraying is conducted in the atmosphere.

According to spraying the metallic glass particle of an amorphous phase, and forming the thermal sprayed coating by solidifying and laminating of the metallic glass thermal spray particle in a super-cooled state on the substrate surface, this method is advantageous for obtaining the thermal sprayed coating, with almost no pores and no pinholes, of a homogeneous amorphous metallic glass.

When cooled from a melt to a solid, the crystalline alloys generally used as thermal spray materials would produce a few percent solidification shrinkage.

When metallic glass is cooled from a melt to a solid, since it first enters the super-cooled liquid state, solidification shrinkage due to crystallization does not occur, and the volume shrinks continuously and slightly in accordance with the heat expansion coefficient in the super-cooled liquid region. If the metallic glass is cooled from the super-cooled liquid state below the melting point without allowing it to melt, the amount of shrinkage decreases further in comparison with when it is cooled from a melt.

If the metallic glass is thermal sprayed in the super-cooled liquid state without allowing it to melt, the residual stress produced on the interface between the substrate and the thermal sprayed film becomes very small, which is effective for suppressing deformation of or damage to the substrate and further preventing detachment of the thermal sprayed film, which is effective especially on a thin substrate.

With the method described above, a very dense, amorphous metallic glass layer can be formed by thermal spraying it on the surface of the substrate. For example, a thermal sprayed metallic glass layer with a porosity of up to 2% and without any pinholes can be obtained. Image analysis is performed on a given section of the metallic glass layer, and the maximum pore area ratio can be adopted as the porosity. The absence of pinholes can also be confirmed through image analysis on a given section of the metallic glass layer. This method is disclosed in Japanese Unexamined Patent Application Publication No. 2006-214000.

Thermal Process for Removing Strain

Just a little residual stress generated by cooling from the super-cooled liquid state causes strain in the magnetostrictive film. This strain leads to inverse magnetostrictive effects, and stress-induced anisotropy increases the magnetic anisotropy energy, making it impossible to obtain large magnetostriction in a small magnetic field in some cases. If the residual stress is reduced, magnetostriction can be increased further. Therefore, according to the present invention, after the metallic glass is thermal sprayed onto the substrate to form a layer, thermal processing is performed to remove strain from the magnetostrictive film.

The thermal processing temperature is set to a temperature such that the thermal sprayed film does not enter the super-cooled liquid state. By performing thermal processing of the thermal sprayed film in the amorphous solid state at a temperature lower than the glass transition temperature (Tg) and not lower than the Curie point (Tc), strain caused by residual stress can be efficiently removed, and the strain of the magnetostrictive film can be brought close to zero while no magnetic field is applied. If thermal processing is performed at a temperature lower than the Curie point, by increasing the period, strain caused by residual stress can be removed in the same manner, but this method is not industrially efficient. The thermal processing time is set depending on the size and shape of the target, and the strain removal time can be reduced at a temperature lower than the glass transition temperature and not lower than the Curie point.

If the thermal processing temperature is higher than the glass transition temperature and lower than the crystallization temperature, part of the thermal sprayed film is crystallized and cannot exhibit soft magnetic properties in some cases.

Any known thermal processing method that can achieve the object of the present invention can be adopted without restriction. Those methods include a method of thermal processing the whole substrate including the magnetostrictive film, and a method of partial thermal processing only in the vicinity of the interface with the magnetostrictive film, for example. One convenient method is a batch thermal processing method in which the target, including the substrate, is put into a heating furnace. Heating is generally performed in the air, but if the effects of oxidization are feared, heating may be carried out in an inert gas atmosphere.

The magnetostrictive film and magnetostrictive element in this embodiment do not require the large-scale equipment that is needed in the conventional liquid quenching technique, consequently reducing the manufacturing cost. Unlike Patent Literature 3, the thermal spray-formed magnetostrictive film does not need to be attached to the surface of the object under test by an adhesive and has good adhesion, and is secure against exfoliation. The magnetostrictive properties in a magnetic field near zero magnetic field are improved.

With the magnetostrictive film or magnetostrictive element, a force sensor, torque sensor, and a pressure sensor with high detection sensitivity can be provided.

The magnetostrictive film and magnetostrictive element of the present invention can be used as a force sensor, a torque sensor, or a pressure sensor that utilizes inverse magnetostrictive effects and can also be applied to a magnetostrictive actuator that utilizes strain generated by an applied magnetic field.

EXAMPLES

The present invention will be described in more detail with the following examples, but the present invention is not limited to them. In one of the examples described below, films were thermal spray-formed under different film formation conditions, and their magnetostrictive properties were measured and evaluated.

Manufacturing Conditions

Of many possible compositions of metallic glass, three compositions (FeSiBPC, FeSiBNb, and FeSiBPCCr) were selected. Hereafter, $Fe_{76}Si_{5.7}B_{9.5}P_5C_{3.8}$ is referred to as composition I, $Fe_{72}Si_{9.6}B_{14.4}Nb_4$ as composition II, and $Fe_{71}Si_{5.7}B_{9.5}P_5C_{3.8}Cr_5$ as composition III.

Metallic glass particles of compositions I, II, and III for thermal spraying were manufactured with the following method.

The following raw materials were used: Fe—electrolytic iron; Si—silicon scrap (6N); B—high-carbon ferroboron, boron crystal; P—ferrophosphorus (20% P); C—activated carbon; Cr—chromium carbide, chromium metal; Nb: niobium metal. The master alloy was produced by mixing the raw materials at the composition ratio, fusing them in a high-frequency melting furnace (alumina crucible, vacuum of about $10^{-1}$ Pa, Ar displacement), and cooling in a copper mold. Atomization was performed with a gas atomizing method, the obtained grains were sorted by an ultrasonic shaking sieve, and grains of 25 to 53 μm were obtained.

Test specimens were formed of a substrate (SUS631 3/4H or SUS316, Kaishin Industry Co., Ltd.) and a metallic glass film thermal sprayed on the substrate. The substrate was a 3 mm×25 mm, 0.3 mm-thick rectangular thin sheet.

The conditions for thermal spraying onto the substrate were as follows: plasma spraying equipment—Triple xPro-200 of Sulzer Metco; current—450 A; power—57 kW; plasma gases—Ar and He; spraying distance—100 mm; spraying gun travel speed—600 mm/s.

By thermal spray-forming the metallic glass film on the substrate, three types of test specimens with different thermal sprayed film thicknesses (100, 200, and 300 μm) were prepared. After thermal spraying, the test specimens were subjected to thermal processing for a given duration at a predetermined temperature. Table 1 lists the Curie point Tc, the glass transition temperature Tg, and the crystallization initiation temperature Tx of compositions I, II, and III. Table 2 shows the compositions, thermal sprayed film thicknesses, substrates, and thermal processing conditions of the test specimens (1 to 20).

TABLE 1

| COMPOSITION | CURIE POINT Tc [° C.] | GLASS TRANSITION TEMPERATURE Tg [° C.] | CRYSTALLIZATION TEMPERATURE Tx [° C.] |
| --- | --- | --- | --- |
| I | 410 | 484 | 544 |
| II | 327 | 533 | 603 |
| III | 415 | 494 | 537 |

TABLE 2

| | COMPO-SITION | THERMAL SPRAYED FILM THICKNESS d [μm] | SUBSTRATE | THERMAL PROCESSING TEMPERATURE [° C.] | THERMAL PROCESSING TIME [h] |
|---|---|---|---|---|---|
| SPECIMEN 1 | I | 200 | SUS316 | 530 | 1 |
| SPECIMEN 2 | I | 200 | SUS316 | 470 | 1 |
| SPECIMEN 3 | I | 200 | SUS316 | 450 | 1 |
| SPECIMEN 4 | I | 200 | SUS316 | 450 | 3 |
| SPECIMEN 5 | I | 200 | SUS316 | 450 | 5 |
| SPECIMEN 6 | I | 200 | SUS316 | 390 | 1 |
| SPECIMEN 7 | I | 200 | SUS316 | — | — |
| SPECIMEN 8 | II | 200 | SUS316 | 470 | 1 |
| SPECIMEN 9 | II | 200 | SUS316 | 450 | 1 |
| SPECIMEN 10 | II | 200 | SUS316 | 450 | 3 |
| SPECIMEN 11 | II | 200 | SUS316 | 300 | 1 |
| SPECIMEN 12 | II | 200 | SUS316 | — | — |
| SPECIMEN 13 | I | 100 | SUS631 · 3/4H | 450 | 1 |
| SPECIMEN 14 | I | 200 | SUS631 · 3/4H | 450 | 1 |
| SPECIMEN 15 | I | 300 | SUS631 · 3/4H | 450 | 1 |
| SPECIMEN 16 | III | 100 | SUS631 · 3/4H | 450 | 1 |
| SPECIMEN 17 | III | 200 | SUS631 · 3/4H | 450 | 1 |
| SPECIMEN 18 | III | 300 | SUS631 · 3/4H | 450 | 1 |
| SPECIMEN 19 | I | 100 | SUS631 · 3/4H | 200 | 1 |
| SPECIMEN 20 | I | 100 | SUS631/3/4H | 200 | 12 |

Measuring Method

When a magnetic field was applied with a magnetic exciting coil, the amount of magnetostriction was measured.

Figure 2:
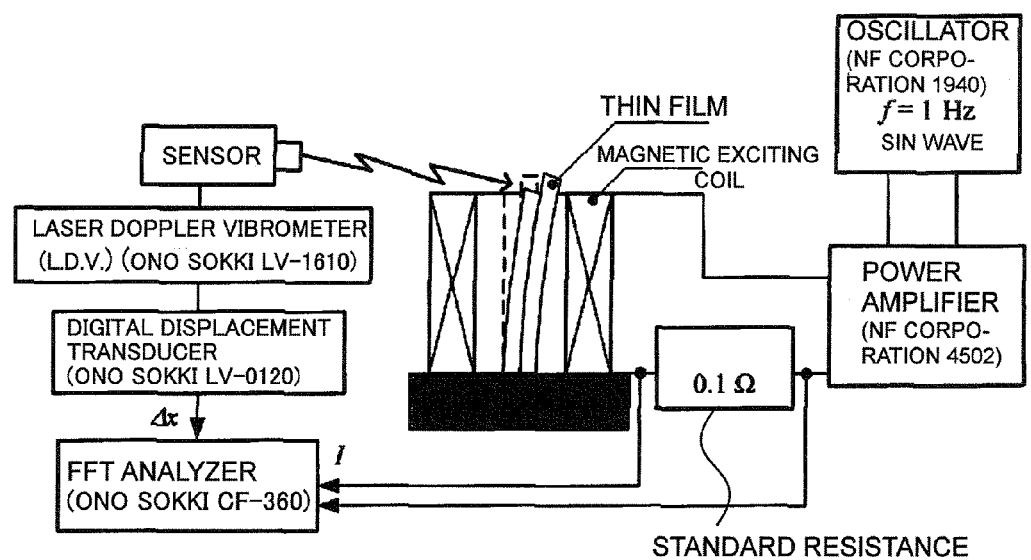
FIG. 2 is a block diagram showing a method of measuring magnetostrictive properties in an example.

FIG. 2 is a block diagram showing the measurement method. As shown in FIG. 2 with product numbers, an oscillator (NF Corporation), a power amplifier (NF Corporation), a laser Doppler vibrometer (Ono Sokki Co., Ltd.), a digital displacement transducer (Ono Sokki Co., Ltd.), and an FFT analyzer (Ono Sokki Co., Ltd.) were used.

The oscillator supplied a 1-Hz sine wave to the coil. The magnetic field applied to the test specimens can be calculated from the coil current I and the coil specifications, as given by expressions (1) and (2). The magnetic field H in the coil is given by the following expression.

Equation 1

$$H = \frac{NI}{2l(r_2-r_1)}\left[\left(\frac{l}{2}+z\right)\ln\frac{r_2+\sqrt{r_2^2+\left(\frac{l}{2}+z\right)^2}}{r_1+\sqrt{r_1^2+\left(\frac{l}{2}+z\right)^2}} + \left(\frac{l}{2}-z\right)\ln\frac{r_2+\sqrt{r_2^2+\left(\frac{l}{2}-z\right)^2}}{r_1+\sqrt{r_1^2+\left(\frac{l}{2}-z\right)^2}}\right] \quad (1)$$

The magnetic field H at the center of the coil (Z=0) is given by the following expression.

Equation 2

$$H = \frac{NI}{2(r_2-r_1)}\ln\frac{r_2+\sqrt{r_2^2+\left(\frac{l}{2}\right)^2}}{r_1+\sqrt{r_1^2+\left(\frac{l}{2}\right)^2}} \quad (2)$$

Here, H: Generated magnetic field [A/m]
N: Number of coil turns
I: Current [A]
$r_1$: Inner radius [m]
$r_2$: Outer radius [m]
l: Coil length [m]
z: Distance from coil center [m].
Table 3 lists the measurement conditions.

TABLE 3

| | ITEMS | VALUE |
|---|---|---|
| SPECIFICATION OF COIL | NUMBER OF COIL TURNS N | 800 TURNS |
| | COIL LENGTH l | 20 mm |
| | INNER DIAMETER $2r_1$ | 6 mm |
| | OUTER DIAMETER $2r_2$ | 18 mm |
| | WIRE DIAMETER | φ0.4 mm |
| | DIRECT CURRENT RESISTANCE R | 1.39 Ω |
| MEASUREMENT FREQUENCY f | | 1 Hz |
| MAXIMUM MAGNETIC FIELD $H_m$ | | 40 kA/m, 80 kA/m |

Figure 3:
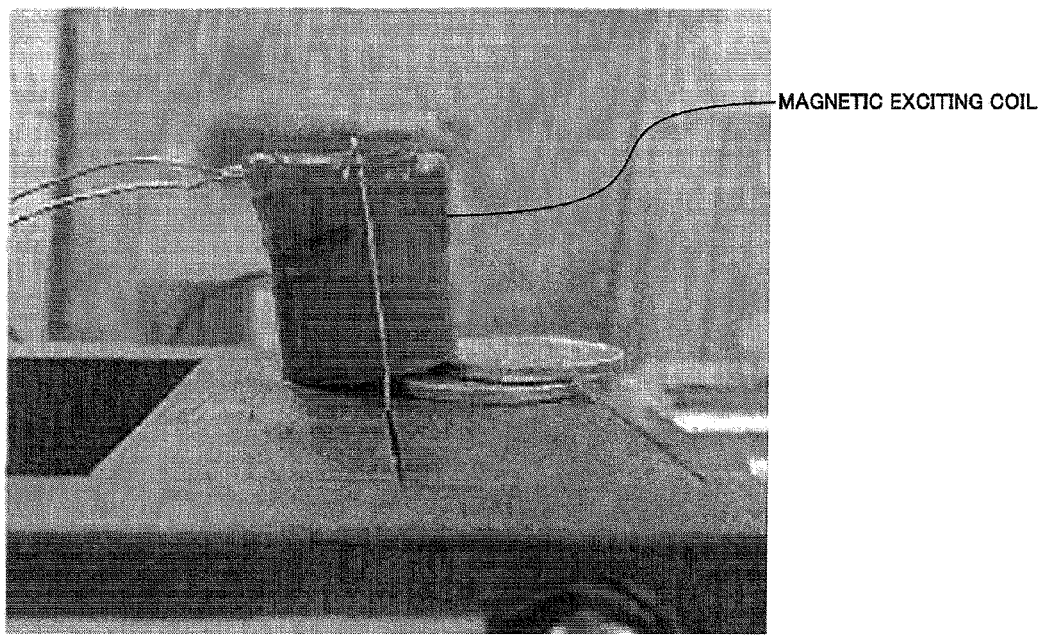
FIG. 3 is a photograph showing a magnetizing coil used in measuring magnetostrictive properties.

Each test specimen was set upright with the longitudinal axis kept in an approximately perpendicular position, and with the magnetic exciting coil having a large number of turns, as shown in Table 3, a magnetic field of up to 40 kA/m or 80 kA/m was applied. FIG. 3 is a photograph showing the actually positioned coil. Because the test specimen was bent, the coil was tilted as shown in the figure, such that the test specimen was placed along the central axis of the coil.

As shown in the block diagram in FIG. 2, the top end of the test specimen displaced by the applied magnetic field H, that is, the amount of magnetostriction of the thin film, was measured by the laser Doppler vibrometer and the digital displacement transducer. The laser Doppler vibrometer was tilted with the irradiation surface of the test specimen being taken into consideration.

The detected value of the coil current I and the displacement ΔX from the digital displacement transducer were input to the FFT analyzer, and a magnetic field—vs.—the amount of magnetostriction (variation) curve was created.

Measurement Results

Table 4 shows the relationships between the measurement conditions of the test specimens and the maximum amount of magnetostriction. The measurement results of test specimens 1 to 12 were obtained in a magnetic field (Hm) of up to 40 kA/m, and the results of test specimens 13 to 20 were obtained in a magnetic field (Hm) of up to 80 kA/m.

within a magnetic field of ±15 kA/m. Test specimen 11, subjected to thermal processing at a temperature (300° C.) lower than the Curie point, and test specimen 12 (not subjected to thermal processing), which were beyond the

TABLE 4

| | COMPOSITION | THERMAL SPRAYED FILM THICKNESS d [μm] | THERMAL PROCESSING CONDITION TEMPERATURE × PROCESSING TIME | MAXIMUM VARIATION OF MAGNETO-STRICTION $X_m$ [μm] | MAGNETIC FIELD IN CASE THAT A VARIATION OF MAGNETO-STRICTION SHOWS ZERO [kA/m] |
|---|---|---|---|---|---|
| SPECIMEN 1 | I | 200 | 530 × 1 | — | — |
| SPECIMEN 2 | I | 200 | 470 × 1 | −34.0 | 0.41 |
| SPECIMEN 3 | I | 200 | 450 × 1 | −30.2 | 1.22 |
| SPECIMEN 4 | I | 200 | 450 × 3 | −32.1 | 0.87 |
| SPECIMEN 5 | I | 200 | 450 × 5 | −33.3 | 0.71 |
| SPECIMEN 6 | I | 200 | 390 × 1 | −21.6 | 0.71 |
| SPECIMEN 7 | I | 200 | — | −25.8 | 0.20 |
| SPECIMEN 8 | II | 200 | 470 × 1 | −17.7 | 0.20 |
| SPECIMEN 9 | II | 200 | 450 × 1 | −20.9 | 0.80 |
| SPECIMEN 10 | II | 200 | 450 × 3 | −21.8 | 0.50 |
| SPECIMEN 11 | II | 200 | 300 × 1 | −14.9 | 0.30 |
| SPECIMEN 12 | II | 200 | — | −14.8 | 0.50 |
| SPECIMEN 13 | I | 100 | 450 × 1 | −23.7 | 1.80 |
| SPECIMEN 14 | I | 200 | 450 × 1 | −29.6 | 2.01 |
| SPECIMEN 15 | I | 300 | 450 × 1 | −27.1 | 0.95 |
| SPECIMEN 16 | III | 100 | 450 × 1 | −12.2 | 1.38 |
| SPECIMEN 17 | III | 200 | 450 × 1 | −19.4 | 2.01 |
| SPECIMEN 18 | III | 300 | 450 × 1 | −12.8 | 1.59 |
| SPECIMEN 19 | I | 100 | 200 × 1 | −10.1 | 0.95 |
| SPECIMEN 20 | I | 100 | 200 × 12 | −20.4 | 1.80 |

The magnetostrictive properties of the test specimens are shown in FIGS. 4 to 9.

Properties of Composition I

Figure 4:
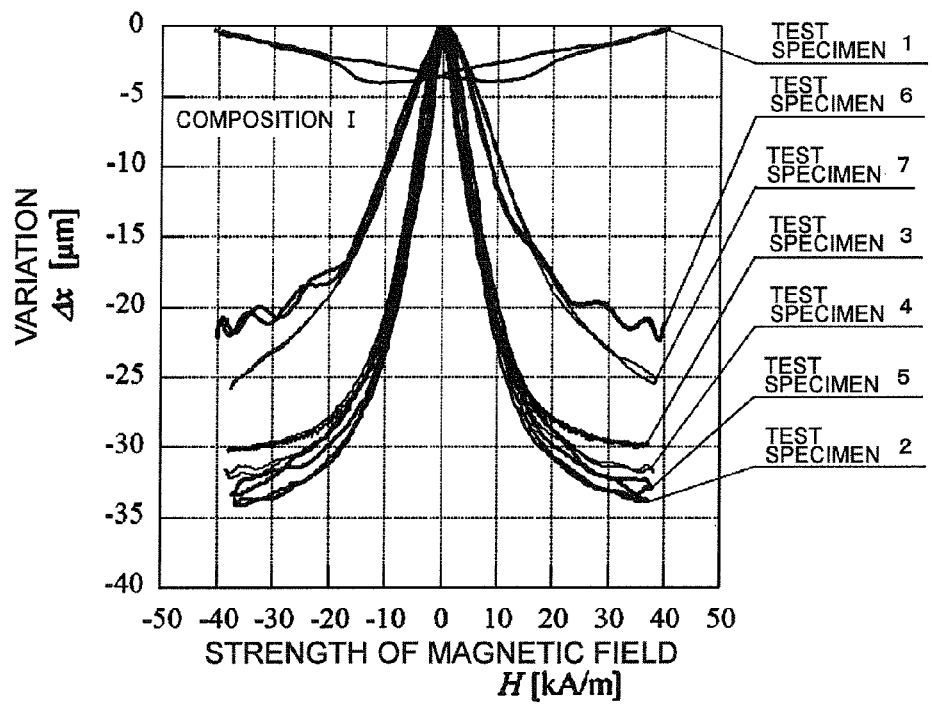
FIG. 4 is a view illustrating the magnetostrictive properties of FeSiBPC (composition I).

FIG. 4 shows the magnetostrictive properties of test specimens 1 to 7. In the figure, the variation represented by the vertical axis corresponds to the amount of magnetostriction in this embodiment. Among test specimens 1 to 7 using the composition I, test specimen 2 showed the best properties. The range in which the magnetic field and the amount of magnetostriction (variation) showed a linear relationship (linearity) extended close to zero magnetic field, and the range of linearity was within a magnetic range of ±15 kA/m. Residual strain in the range of linearity was the greatest amount.

In those examples, test specimens 2 to 5, whose thermal processing temperature was lower than the glass transition temperature (Tg=484° C.) and not lower than Curie point (410° C.), had good linearity near zero magnetic field and had a large strain. Test specimen 1, subjected to thermal processing at a temperature (530° C.) above the glass transition temperature, which was beyond the range of this example, did not show a linear relationship between the applied magnetic field and the variation in the range of ±15 kA/m and had a variation close to zero. Test specimen 6, subjected to thermal processing at a temperature (390° C.) lower than the Curie point, and test specimen 7 (not subjected to thermal processing), which were beyond the range of this example, showed a broad peak near zero magnetic field and a small strain.

Properties of Composition II

Figure 5:
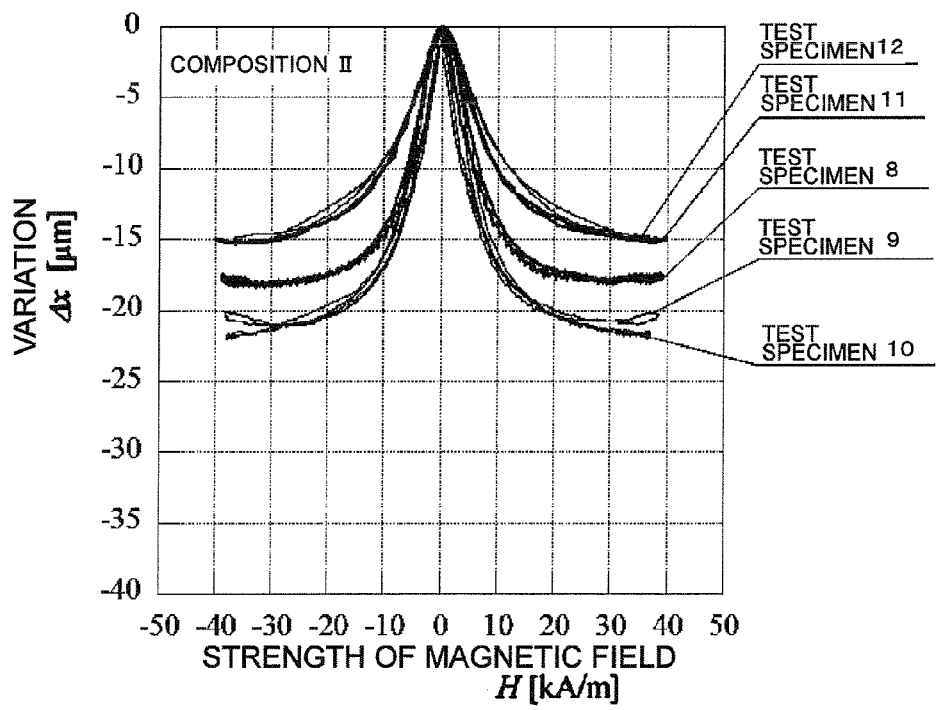
FIG. 5 is a view illustrating the magnetostrictive properties of FeSiBNb (composition FIG. 6 is a view showing the magnetostrictive prosperities of test specimens of composition I with different thicknesses (100, 200, and 300 μm).

FIG. 5 shows the magnetostrictive properties of test specimens 8 to 12. Test specimens 8 to 10, subjected to thermal processing at a temperature lower than the glass transition temperature and not lower than the Curie point in this example, had a range in which the magnetic field and the amount of magnetostriction showed linearity, extending close to zero magnetic field, and the range of linearity was within a magnetic field of ±15 kA/m. Test specimen 11, subjected to thermal processing at a temperature (300° C.) lower than the Curie point, and test specimen 12 (not subjected to thermal processing), which were beyond the range of this example, showed a broad peak near zero magnetic field and a small strain.

Comparison between test specimens having different compositions and using the same measurement conditions indicates that composition I has a greater amount of magnetostriction in the range of linearity than composition II under any measurement conditions.

Dependence on Film Thickness

Figure 6:
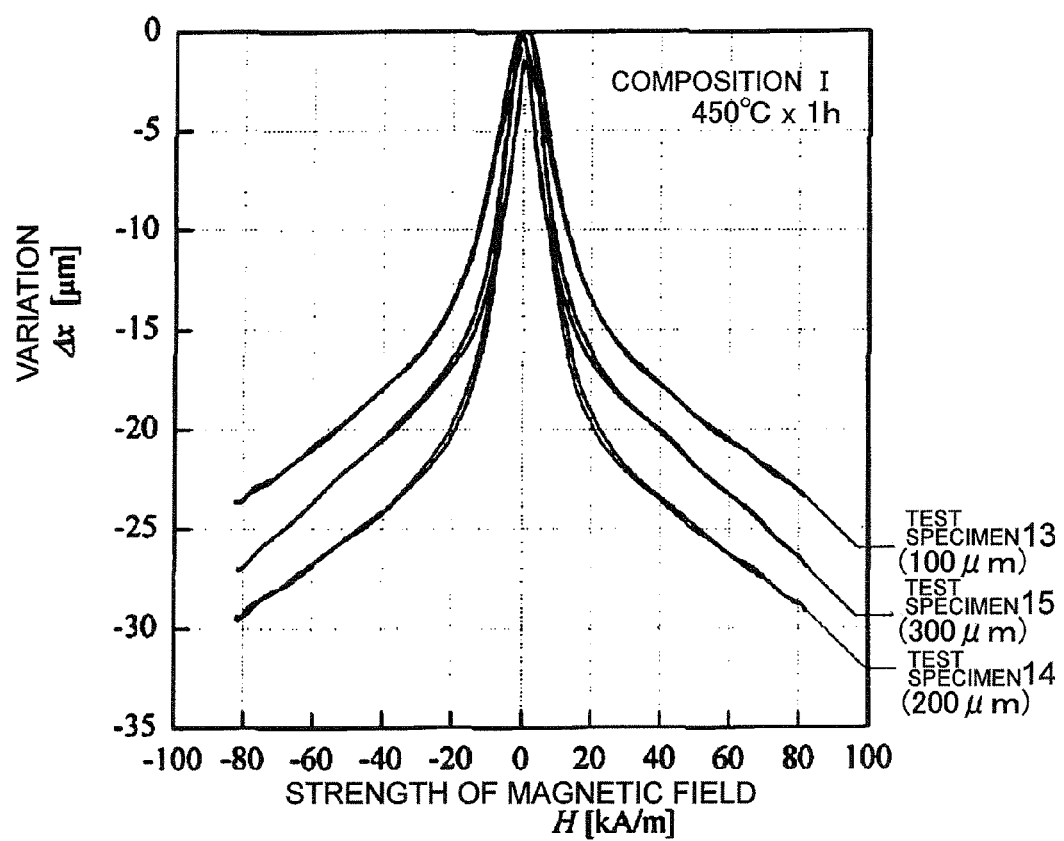
Figure 7:
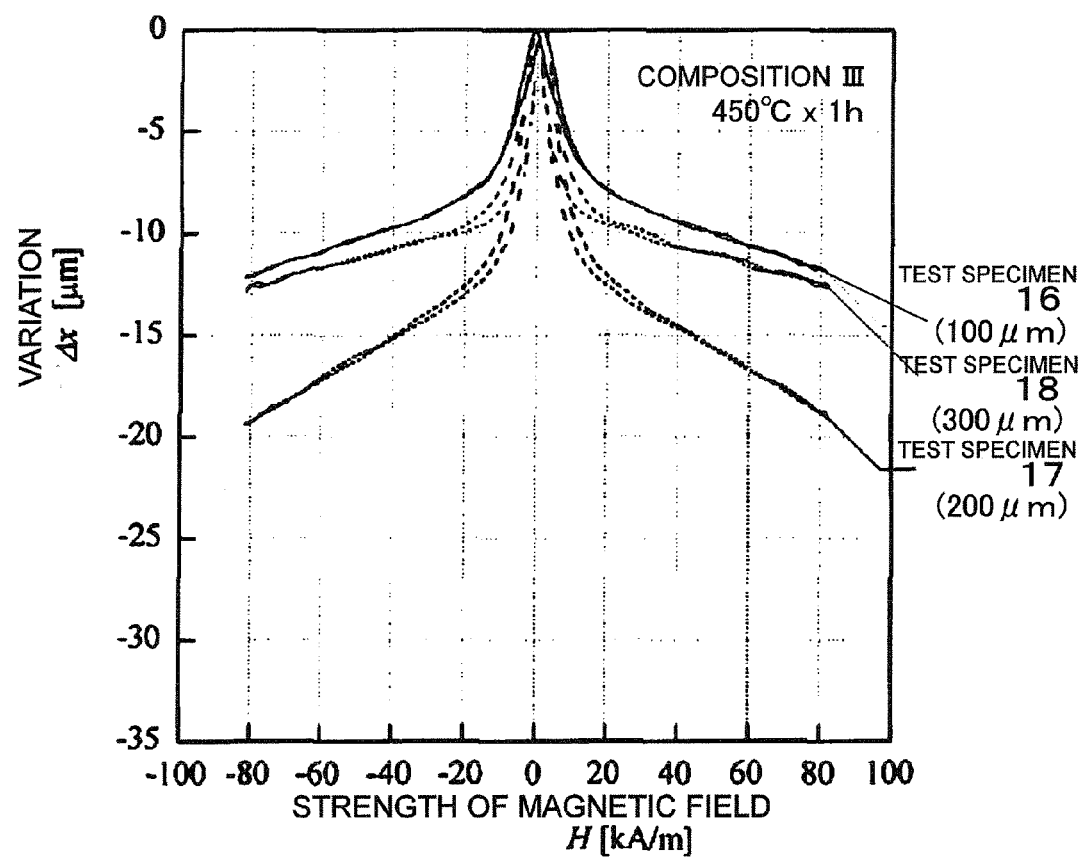
FIG. 7 is a view showing the magnetostrictive properties of FeSiBPCCr (composition III) compared with the FIG. 6.

FIGS. 6 and 7 show the properties of three test specimens having different film thickness: Test specimens 13, 14, and 15 (composition I) and test specimens 16, 17, and 18 (composition III), respectively. The amount of magnetostriction in the range of linearity of both composition I and composition III was the smallest, with a thickness of 100 μm, was greater with a thickness of 300 μm, and became even greater with a thickness of 200 μm; that is, the 200 μm-thick test specimen exhibited the best magnetostrictive properties.

Dependence on Thermal Processing Time

By performing thermal process at a temperature not lower than the Curie point and lower than the glass transition temperature, the thermal sprayed layer was subjected to thermal processing in the amorphous solid state, strain caused by residual stress was eliminated efficiently, and the strain of the magnetostrictive film could be brought closer to zero while no magnetic field was applied. If thermal processing is performed at a temperature lower than the Curie point, by increasing the processing time, strain caused by residual stress can be removed in the same manner, but this method is not industrially efficient.

Figure 8:
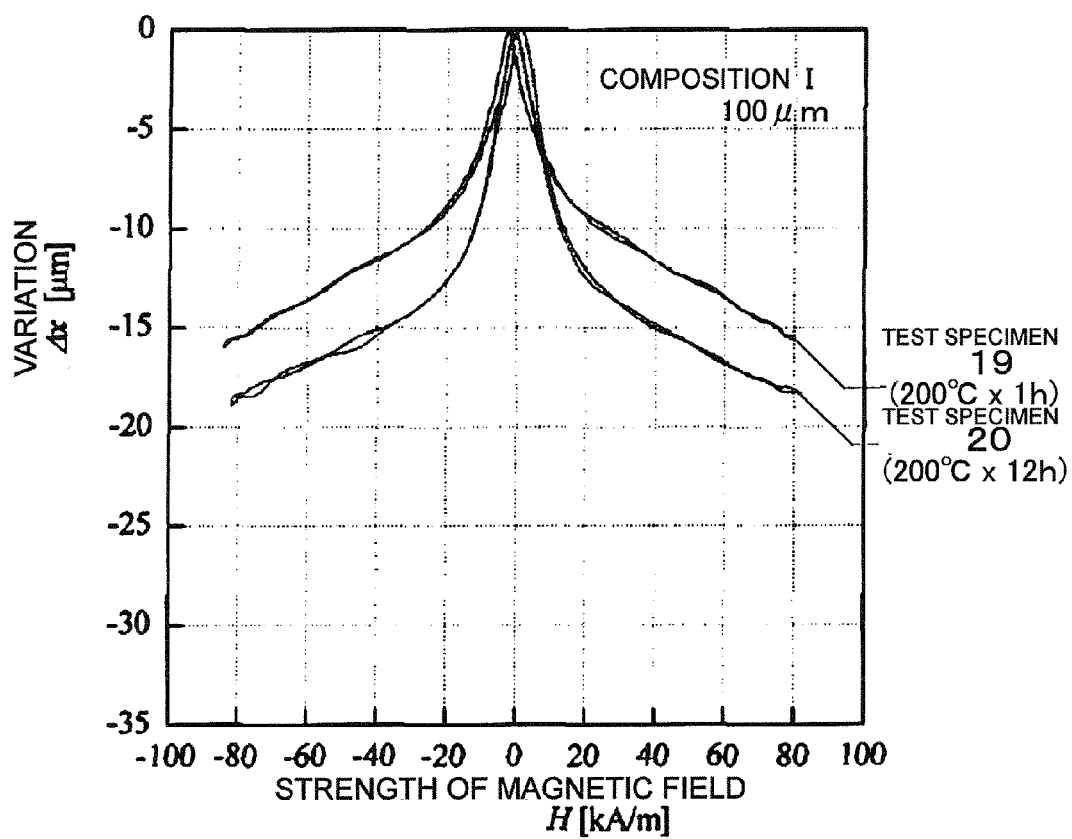
FIG. 8 is a view showing the magnetostrictive properties of test specimens of composition I subjected to thermal processing at 200° C. with different thermal processing times (1 h and 12 h).

FIG. 8 shows the properties of two test specimens 19 and 20 (composition 1) differing only in the thermal processing time. Even when the thermal processing temperature was 200° C., which was lower than the Curie point, the amount of magnetostriction obtained by 12 hours of thermal processing was greater than that obtained by 1 hour of thermal processing. Comparison with test specimen 13, which differed only in the thermal processing temperature, indicates that thermal processing at a temperature not lower than the Curie point and lower than the glass transition temperature could eliminate strain caused by residual stress efficiently in a shorter period.

Reproducibility

Figure 9:
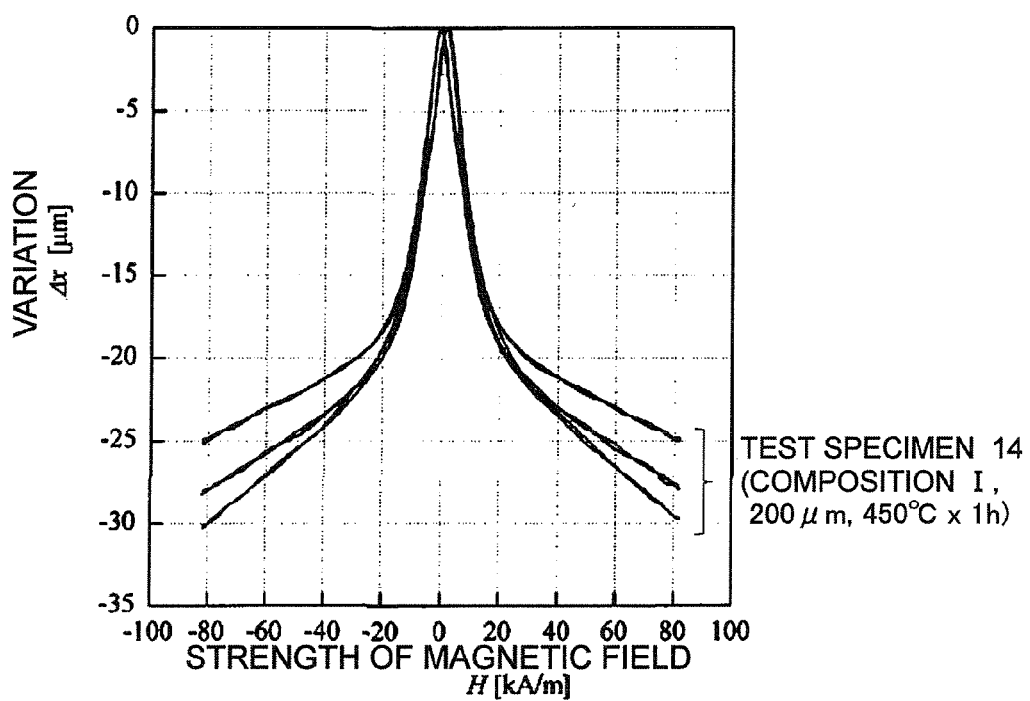
FIG. 9 is a view showing magnetostrictive properties of test specimen 14 of composition I.

FIG. 9 shows the magnetostrictive properties of three pieces created as test specimen 14 (thermal sprayed film thickness of 200 μm, and one hour of thermal processing at 450° C.) of composition I. The variation were almost the same in a magnetic field ranging from −15 kA/m to +15 kA/m (both inclusive) and the variation was small.

The effects of differences in composition, film thickness, and thermal processing conditions on the magnetostrictive properties can be summarized as (1) to (3) below.

(1) Any test specimen subjected to thermal processing at a temperature not lower than the Curie point and lower than the glass transition temperature showed a linear relationship (linearity) between the magnetic field and the magnetostriction at least in a part of a magnetic field ranging from −15 kA/m to +15 kA/m (both inclusive). When the magnetic field was applied, the magnetic field—vs.—magnetostriction curve rose quickly to the range of linearity, and favorable magnetostrictive properties could be exhibited in a magnetic field smaller than ever. A test specimen subjected to thermal processing at a temperature exceeding the glass transition temperature might not show linearity. A test specimen subjected to thermal processing at a temperature lower than the Curie point showed degraded properties in a low magnetic field unless it was subjected to long thermal processing. That is, a broad peak appeared near zero magnetic field and the variation decreased.

(2) Three test specimens in the same shape were prepared, and their amounts of magnetostriction were measured under the same measurement conditions. The magnetostrictive properties varied little.

(3) The relationship between film thickness (100 μm, 200 μm, and 300 μm) and the amount of magnetostriction was examined, and the amount of magnetostriction was the greatest with a film thickness of 200 μm.

In the example described above, the magnetostrictive properties of the magnetostrictive films thermal spray-formed on the rectangular thin sheets of the substrates were evaluated. A magnetostrictive torque sensor for detecting a torque applied to a shaft was formed by thermal spray-forming a magnetostrictive film of the present invention on the surface of the shaft and providing an exciting coil and a detecting coil, and the sensitivity of the sensor was evaluated as described below.

Figure 10A:
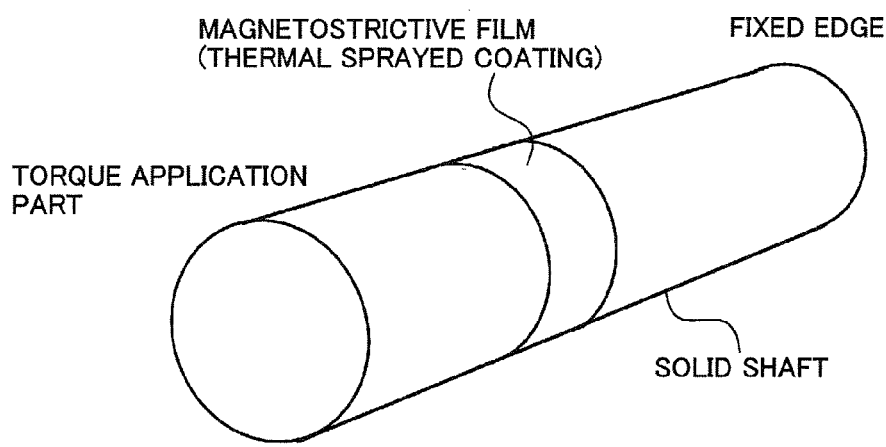
FIG. 10 is a view showing the positional relationship between the thermal sprayed shaft and a magnetostrictive torque sensor (MTS) used in torque evaluation.
Figure 10B:
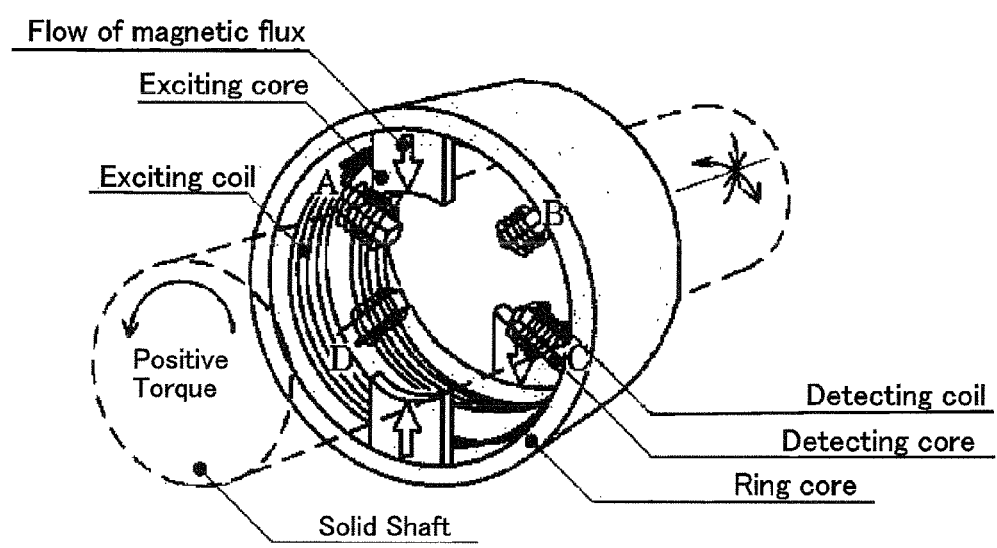

FIG. 10A is a perspective view of the shaft (material: SUS631) with a magnetostrictive film thermal spray-formed on its outer surface. The magnetostrictive film of composition I was thermal spray-formed to a thickness of 200 μm. After the thermal spraying, the thermal sprayed shaft was subjected to one hour of thermal processing at 450° C. in a vacuum furnace. FIG. 10B is a perspective view showing the exciting coil and the detecting coil disposed to surround the magnetostrictive film. One end of the shaft was secured, and a positive torque and a negative torque were applied at the other end. A torque applied to a torque application part in the clockwise direction was defined as a positive torque, and a torque applied in the counterclockwise direction was defined as a negative torque.

The exciting coil was formed on the inner surface of a ring core. Since the shaft penetrated the ring core, the exciting coil surrounded the perimeter of the magnetostrictive film. When a sine-wave voltage was applied to the exciting coil, the shaft functioned as a core to generate a magnetic field. The generated magnetic field was detected by four detecting coils A to D disposed inside the ring core. When a torque is applied to the shaft, the magnetostrictive film is deformed to change the magnetic flux, changing the magnitude of the magnetic field to be detected. By detecting the change in the magnitude of the magnetic field by the detecting coil, the magnitude of torque can be measured.

Figure 11:
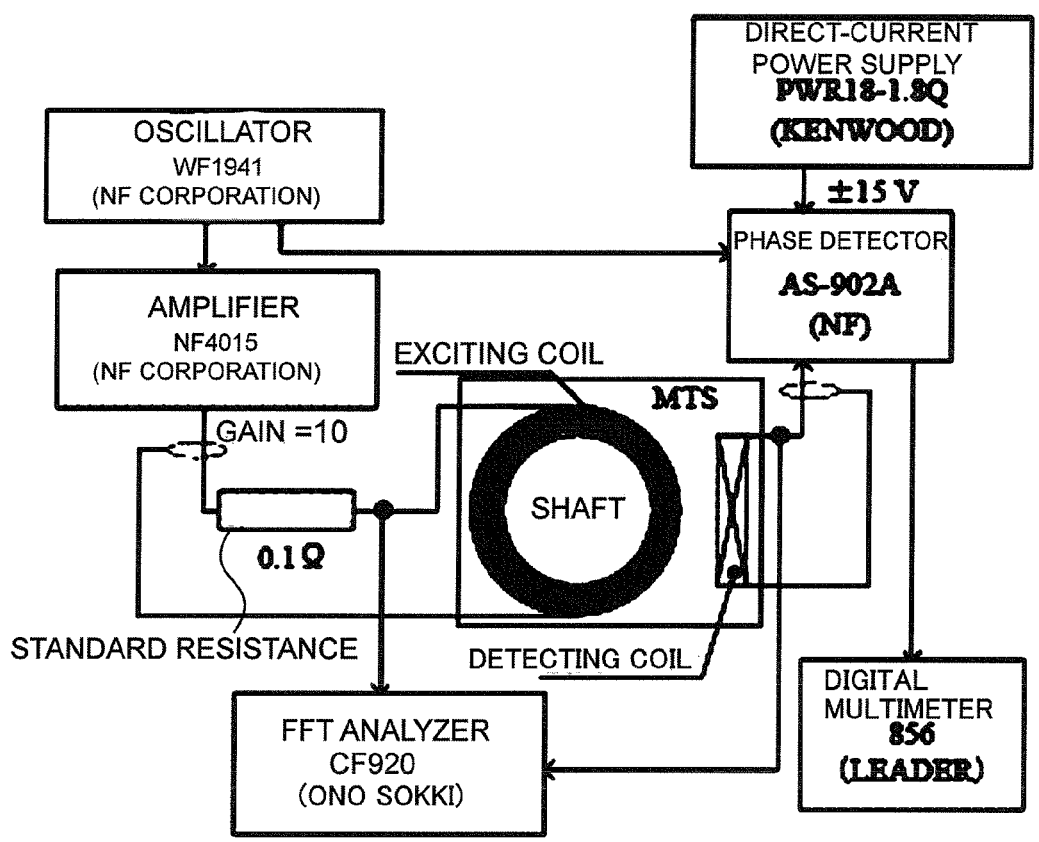
FIG. 11 is a block diagram of measurement for torque evaluation.

FIG. 11 shows a block diagram of measurement by the magnetostrictive torque sensor. A sine wave from an oscillator was input to the exciting coil through an amplifier, and a magnetic field was generated in the exciting coil. The value of the excited magnetic field was checked by channel A of an FFT analyzer. When a torque was applied to the shaft, a change in magnetic flux was read by the detecting coil. The signal from the detecting coil was input to a phase detector. The phase detector synchronously detected a signal from the detecting coil, using the sine wave from the oscillator as the reference signal. By passing the signal from the detecting coil through the phase detector, a signal in same phase with the reference signal was taken out as direct current and measured by a multimeter. The measured value was evaluated as the output voltage of the torque sensor. At the same time, the phase difference between the input voltage and the output voltage was measured by using channel B of the FFT analyzer.

Figure 12:
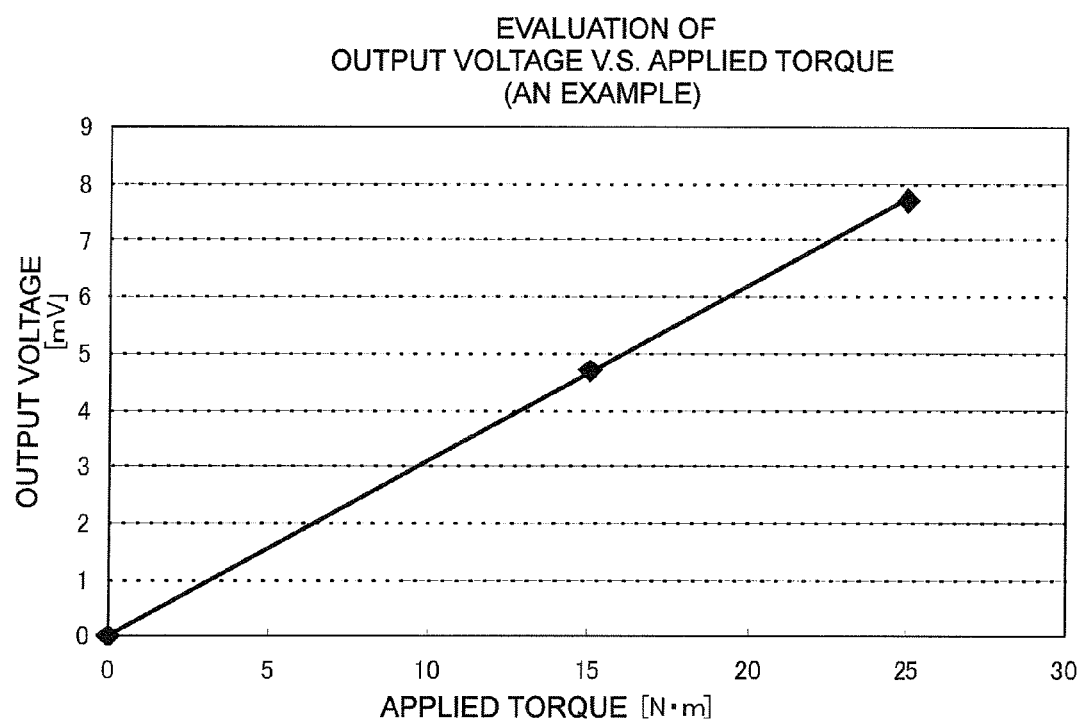
FIG. 12 is a graph showing a result (an example) of output voltage with respect to applied torque.

FIG. 12 shows an example of torque evaluation by using the magnetostrictive torque sensor. It was confirmed that the output voltage value was proportional to the applied torque. The proportional characteristics were exhibited especially at a low torque up to 30 N·m, and a very high sensor sensitivity of 3.0 to 3.5 mV/(10 N·m) was obtained.

What is claimed is:

1. A magnetostrictive film thermal sprayed on an object under test, including a metallic glass film applied as a supercooled liquid having a supercooled liquid temperature range ΔTx equal to or more than 30° C., subjected to thermal processing at a temperature lower than the glass transition temperature and not lower than the Curie point, and showing a linear relationship between the magnetic field and the magnetostriction in at least a part of the magnetic field ranging from −15 kA/m to zero and in at least a part of the magnetic field ranging from zero to +15 kA/m, and having a variation due to magnetostriction of a test specimen measured at the following conditions:

using a test specimen comprising a 3 mm×25 mm, 0.3 mm-thick rectangular substrate and a 200 μm-thick magnetostrictive film formed on the substrate by thermal spraying; and applying a magnetic field of from −80 kA/m up to +80 kA/m to the test specimen, wherein the variation due to magnetostriction is at least 15 μm or greater and at most 30 μm or smaller in the magnetic field ranging from −15 kA/m to +15 kA/m.

2. A magnetostrictive film according to claim 1, wherein the metallic glass contains Fe in a range of 30 to 80 atomic percent as its main constituent.

3. A magnetostrictive film according to claim 2, wherein the metallic glass is Fe—Si—B-M or Fe—Si—B—P—C-M (M=Cr, Nb, Ta, W, Ni, Co, Hf, Mo or M=none).

4. A magnetostrictive film according to claim 3, wherein the metallic glass is $Fe_{76}Si_{5.7}B_{9.5}P_5C_{3.8}$.

5. A magnetostrictive film according to claim 1, wherein the metallic glass film is formed by high-velocity flame spraying or plasma spraying.

6. A magnetostrictive film according to claim 1, wherein a thickness of the metallic glass film is 50 μm or greater.

7. A magnetostrictive element, including the magnetostrictive film according to claim 1, and performing interconversion between mechanical energy and magnetic energy.

8. A torque sensor using the magnetostrictive film according to claim 1.

9. A force sensor using the magnetostrictive film according to claim 1.

10. A pressure sensor using the magnetostrictive film according to claim 1.

11. A magnetostrictive film thermal sprayed on an object under test, including a metallic glass film applied as a supercooled liquid, subjected to thermal processing at a temperature lower than the glass transition temperature and not lower than the Curie point, and being free of a crystalline phase.

* * * * *